(12) United States Patent
Lee

(10) Patent No.: US 8,270,742 B1
(45) Date of Patent: Sep. 18, 2012

(54) DATA COMPRESSION FOR COMPUTER-AIDED DESIGN SYSTEMS

(75) Inventor: Chong M. Lee, Broomfield, CO (US)

(73) Assignee: Xilinx, Inc., San Jose, CA (US)

( * ) Notice: Subject to any disclaimer, the term of this patent is extended or adjusted under 35 U.S.C. 154(b) by 385 days.

(21) Appl. No.: 12/730,083

(22) Filed: Mar. 23, 2010

(51) Int. Cl.
*G06K 9/36* (2006.01)
*G06K 9/46* (2006.01)

(52) U.S. Cl. ........................................ 382/243; 382/232

(58) Field of Classification Search .................. None
See application file for complete search history.

(56) References Cited

U.S. PATENT DOCUMENTS

| | | | | |
|---|---|---|---|---|
| 4,870,302 | A * | 9/1989 | Freeman | 326/41 |
| 5,070,534 | A * | 12/1991 | Lascelles et al. | 715/764 |
| 5,513,124 | A * | 4/1996 | Trimberger et al. | 716/116 |
| 6,883,156 | B1 * | 4/2005 | Khainson et al. | 716/111 |
| 8,078,970 | B1 * | 12/2011 | Anderson | 715/735 |
| 8,156,458 | B2 * | 4/2012 | Baker et al. | 716/107 |

OTHER PUBLICATIONS

Hauck, S. et al. "Configuration compression for the Xilinx XC6200 FPGA", IEEE Transactions on Computer-Aided Design of Integrated Circuits and Systems, Aug. 1999.*

Weste, N.H.E. "MULGA—An interactive symbolic layout system for the design of integrated circuits", The Bell System Technical Journal, 1981.*

Lysaght, P. et al. "Invited Paper: Enhanced Architectures, Design Methodologies and CAD Tools for Dynamic Reconfiguration of Xilinx FPGAs", International Conference on Field Programmable Logic and Applications, 2006.*

Wikipedia page on Run Length Encoding at http://en.wikipedia.org/wiki/Run-length_encoding, Mar. 24, 2010, 1-3 pp.

* cited by examiner

*Primary Examiner* — Li Liu

(74) *Attorney, Agent, or Firm* — Kevin T. Cuenot

(57) ABSTRACT

A method of compressing data can include forming at least one container by grouping calls of data according to at least one data element of each call. The method can include arranging, via the processor, calls of the at least one container into a plurality of segments according to a minimal coordinate set and extracting common coordinates corresponding to a first coordinate type from the plurality of segments. Coordinates of a second coordinate type of each segment of the at least one container can be replaced with a segment start coordinate and first distance information specifying the coordinates of the second coordinate type. The common coordinates of the at least one container can be replaced with a common start coordinate and second distance information.

20 Claims, 12 Drawing Sheets

300

| 0x08, 1, 0, 5 | 0x08, 1, 0, 30 | 0x08, 1, 20, 15 | 0x08, 2, 20, 40 |
|---|---|---|---|
| 0x08, 1, 10, 5 | 0x08, 1, 10, 25 | 0x08, 2, 10, 10 | 0x88, 1, 20, 10 |
| 0x08, 1, 20, 20 | 0x08, 1, 10, 30 | 0x08, 2, 10, 20 | 0x88, 1, 20, 20 |
| 0x08, 1, 0, 15 | 0x08, 1, 20, 10 | 0x08, 2, 10, 30 | 0x88, 1, 20, 30 |
| 0x08, 1, 0, 20 | 0x08, 1, 0, 10 | 0x08, 2, 10, 40 | 0x88, 1, 20, 40 |
| 0x08, 1, 10, 10 | 0x08, 1, 20, 25 | 0x08, 2, 20, 10 | |
| 0x08, 1, 10, 15 | 0x08, 1, 20, 30 | 0x08, 2, 20, 20 | |
| 0x08, 1, 0, 25 | 0x08, 1, 20, 5 | 0x08, 2, 20, 30 | |

|  | Container 405 | Container 410 | Container 415 |
|---|---|---|---|
| Header | 0x08 | 0x88 | 0x08 |
| Macro Identifier | 1 | 1 | 2 |
| Location(s) | 0, 5 | 20, 30 | 10, 30 |
|  | 10, 5 | 20, 40 | 10, 40 |
|  | 20, 20 |  | 20, 10 |
|  | 0, 15 |  | 20, 20 |
|  | 0, 20 |  | 20, 30 |
|  | 10, 10 |  | 20, 40 |
|  | 10, 15 |  |  |
|  | 0, 25 |  |  |
|  | 0, 30 |  |  |
|  | 10, 25 |  |  |
|  | 10, 30 |  |  |
|  | 20, 10 |  |  |
|  | 0, 10 |  |  |
|  | 20, 25 |  |  |
|  | 20, 30 |  |  |
|  | 20, 5 |  |  |
|  | 20, 15 |  |  |

FIG. 5

| | X-Coordinate | Y-Coordinate |
|---|---|---|
| Unique Coordinate Set | 0, 10, 20 | 5, 10, 15, 20, 25, 30 |

| 405 | Column 1 | Column 2 | Column 3 |
|---|---|---|---|
| Common Coordinates | 0 | 10 | 20 |
| Segment Start Coordinates | 5 | 5 | 5 |
| Y-Coordinates | 5, 10, 15, 20, 25, 30 | 5, 10, 15, 25, 30 | 5, 10, 15, 20, 25, 30 |
| Distance vector | 5, 5, 5, 5, 5 | 5, 5, 10, 5 | 5, 5, 5, 5, 5 |
| Distance code | 5, 5 | 2, 5, 1, 10, 1, 5 | 5, 5 |

1800

| Decoded Coordinate | Derivation of Decoded Coordinate |
|---|---|
| 5 | Start coordinate |
| 10 | 5 + 5 |
| 15 | 5 + 10 |
| 20 | 5 + 15 |
| 25 | 5 + 20 |
| 30 | 5 + 25 |

DATA COMPRESSION FOR COMPUTER-AIDED DESIGN SYSTEMS

FIELD OF THE INVENTION

One or more embodiments disclosed within this specification relate to data compression. More particularly, one or more embodiments relate to data compression for use with computer-aided design systems.

BACKGROUND

Computer-aided design (CAD) refers to the use of computer technology for the design of real, e.g., physical, or virtual objects. CAD systems allow one to create and output, for example, engineering drawings, symbolic information such as materials, processes, dimensions, and tolerances, according to application-specific conventions. CAD systems are used extensively within disparate fields such as drafting, medical imaging, building design, circuit design, and the like.

CAD systems allow a designer to visualize the particular object being created or operated upon. This visualization of objects requires the CAD system to store and utilize a large amount of data. As CAD systems become more powerful, the amount of data that is used and relied upon to generate visualizations grows. In fact, the size of the data for visualizing any of a variety of objects within modern CAD systems can be so large that the time required for sending that data over an Internet connection is prohibitive. This makes updating a library of data used for generating visualizations, e.g., graphical modeling data, within a CAD system difficult.

In illustration, consider that some CAD systems for circuit design allow users to place components of a circuit design as an overlay atop of a visualization of an underlying integrated circuit (IC). CAD systems for circuit design using programmable ICs are one example in which the CAD system displays a schematic view of the underlying IC over which the designer can place various components of a circuit design as one or more overlays. The schematic view itself can be formed from a plurality of layers of graphics specified by graphical modeling data that can be stored as part of the CAD system or within an associated library.

The graphical modeling data that visualizes a schematic for a single type or model of programmable IC can be approximately several hundred megabytes in size. Considering that CAD systems typically allow designers to create circuit designs for implementation within any of a plurality of different programmable ICs available from selected manufacturers, it can be seen that the uncompressed graphical modeling data relating to different ICs within a CAD system can easily exceed one gigabyte.

Modern compression techniques are unable to reduce the size of the data to satisfactory levels. Use of programmable ICs is but one example in which the amount of graphical modeling data necessary for generating visualizations is large. The same is true with regard to CAD systems suited for any of a variety of different fields, whether generalized CAD systems for drafting or schematic generation, or more specialized CAD systems.

SUMMARY

One or more embodiments disclosed within this specification relate to data compression. More particularly, one or more embodiments relate to data compression for use with computer-aided design systems. One embodiment of the present invention can include a method of compressing data that includes: forming at least one container by grouping calls of data according to at least one data element of each call and arranging, via the processor, calls of the at least one container into a plurality of segments according to a minimal coordinate set and extracting common coordinates corresponding to a first coordinate type from the plurality of segments. Coordinates of a second coordinate type of each segment of the at least one container can be replaced with a segment start coordinate and first distance information specifying the coordinates of the second coordinate type. The common coordinates of the at least one container can be replaced with a common start coordinate and second distance information.

Another embodiment of the present invention can include a system for compressing data. The system can include a memory storing program code and a processor coupled to the memory and executing the program code. The processor can be configured to perform steps including forming at least one container by grouping calls of data according to at least one data element of each call and arranging calls of the at least one container into a plurality of segments according to a minimal coordinate set and extracting common coordinates corresponding to a first coordinate type from the plurality of segments. The processor further can be configured to perform steps including replacing coordinates of a second coordinate type of each segment of the at least one container with a segment start coordinate and first distance information specifying the coordinates of the second coordinate type. The processor also can be configured to perform steps including replacing the common coordinates of the at least one container with a common start coordinate and second distance information and storing the at least one container within the memory.

Another embodiment of the present invention can include a device including a non-transitory data storage medium usable by a system having a processor and a memory. The non-transitory data storage medium can store program code that, when executed by the system, causes the system to execute operations for performing data compression including forming at least one container by grouping calls of data according to at least one data element of each call and arranging calls of the at least one container into a plurality of segments according to a minimal coordinate set and extracting common coordinates corresponding to a first coordinate type from the plurality of segments. The non-transitory data storage medium further can cause the system to perform steps including replacing coordinates of a second coordinate type of each segment of the at least one container with a segment start coordinate and first distance information specifying the coordinates of the second coordinate type and replacing the common coordinates of the at least one container with a common start coordinate and second distance information. The at least one container can be stored within the memory.

BRIEF DESCRIPTION OF THE DRAWINGS

FIG. 5 is a second table illustrating container processing in accordance with another embodiment of the present invention.

DETAILED DESCRIPTION OF THE DRAWINGS

Figure 1:
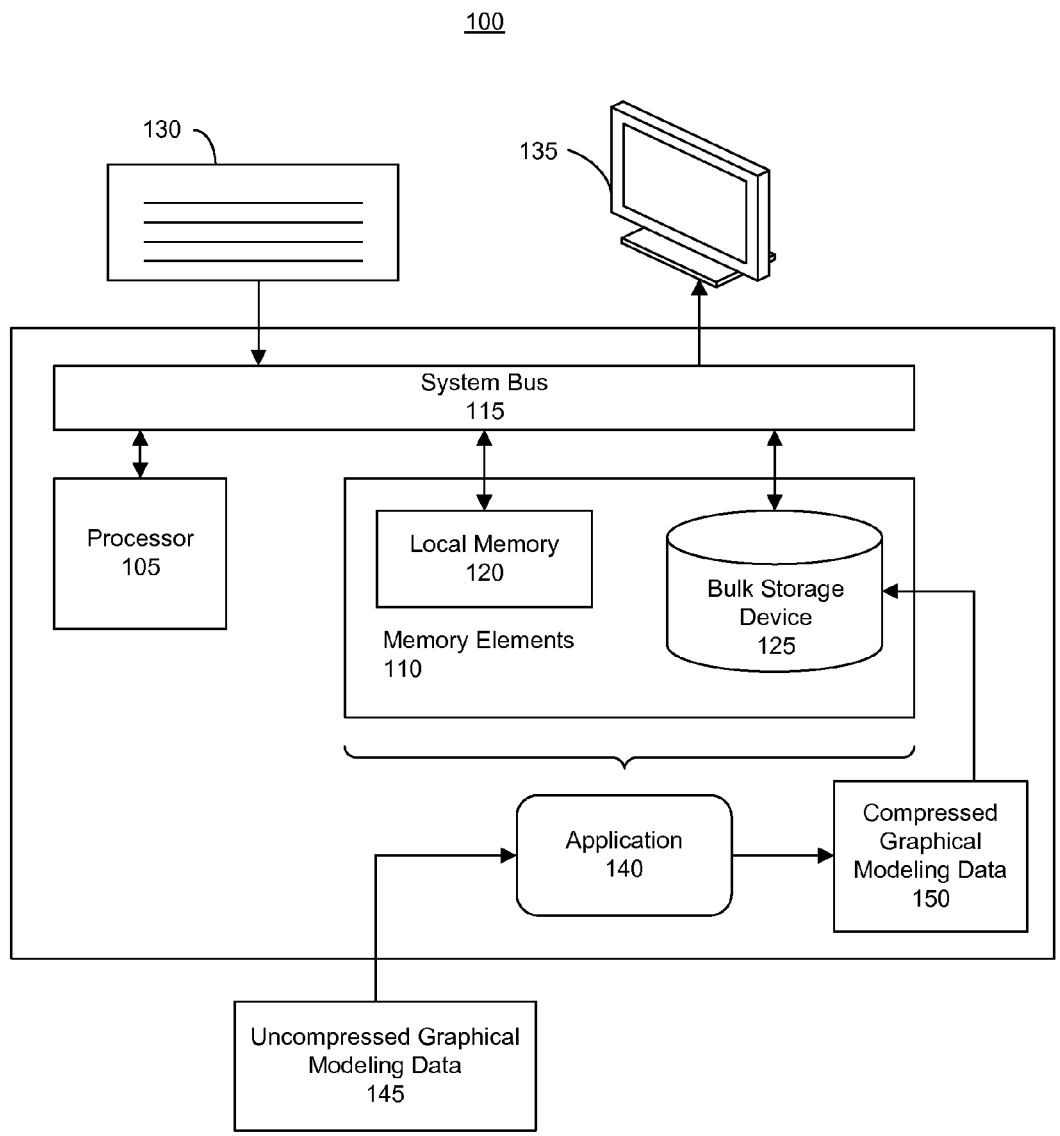
FIG. 1 is a first block diagram illustrating a system for compressing graphical modeling (GM) data in accordance with one embodiment of the present invention.

While the specification concludes with claims defining the features of one or more embodiments of the invention that are regarded as novel, it is believed that one or more embodiments of the invention will be better understood from a consideration of the description in conjunction with the drawings. As required, one or more detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of one or more embodiments of the invention.

One or more embodiments disclosed within this specification relate to data compression and, more particularly, to compression of graphical modeling data. The phrase "graphical modeling data" or "GM data" can refer to a collection of data that specifies a visualization, e.g., a graphical model, of one or more physical or virtual objects within a system for computer-aided design (CAD). For purposes of discussion within this specification, a system that utilizes graphical modeling data can be referred to as a "CAD system."

In general, GM data can include two primary types of data items or objects. The first type of GM data can be a collection or library of graphical objects called "macros." The second type of GM data can include "calls" that instantiate the macros upon a drawing surface, e.g., a display of a CAD system. Referring to the first type of GM data, each macro of the macro library can specify a visual element that can be as simple as a dot, a line, or a shape, e.g., a circle or a rectangle. Macros also can specify visual elements that are more complex in nature and that can be built from a plurality of the more basic visual elements previously noted.

Turning to the second type of GM data, as noted, a call refers to an instantiation of a macro from the macro library. Instantiation of a macro means that the graphical element specified by the instantiated macro is displayed upon a drawing surface, e.g., a display device of a CAD system, to a user. In many CAD systems, the graphical model presented is generated using a large number of calls in relation to the number of macros in the macro library.

For purposes of illustration, consider a CAD system that displays a schematic of an IC over which the user is able to place components of a user-specified circuit design that is being developed. For the CAD system to display a schematic of the underlying IC, as many as 30,000 macros may be needed. Since many macros are instantiated multiple times to display a schematic of the IC, it can be seen that the number of calls can far exceed the number of macros within the GM data. For example, to display a modern programmable IC schematic within a CAD system, more than 15 million calls can be required.

In accordance with one or more embodiments disclosed herein, the GM data can be compressed by applying a plurality of processing steps. The processing steps can be applied to the second type of GM data, i.e., the call-related data, since the size of the call data routinely exceeds the size of the macro library. Thus, in one embodiment, size of the call data within the GM data can be reduced. The GM data can be stored in this format for long term storage, downloading, and the like.

In another embodiment, the call data can be at least partially expanded, or decoded, for storage within runtime memory used by the CAD system during execution. Storing the partially expanded data within runtime memory increases processing speed of the CAD system and reduces, or eliminates, any performance penalty that may be incurred in consequence of the compressed storage of the call data at runtime of the CAD system. Like numbers will be used to refer to the same items throughout this specification.

FIG. 1 is a first block diagram illustrating a system 100 for compressing GM data in accordance with one embodiment of the present invention. System 100 can be a system that uses GM data in performing one or more functions. For example, system 100 can be implemented as a CAD system that visually models various physical or virtual objects. In another embodiment, system 100 can be a system that is tasked with compressing, e.g., encoding, and de-compressing, e.g., decoding, GM data for utilization by, or in cooperation with, another application and/or system.

Accordingly, system 100 can include at least one processor 105 coupled to memory elements 110 through a system bus 115. System 100 can store program code within memory elements 110. Processor 105 can execute the program code accessed from memory elements 110 via system bus 115. In one aspect, for example, system 100 can be implemented as a computer that is suitable for storing and/or executing program code. It should be appreciated, however, that system 100 can be implemented in the form of any system comprising a processor and memory that is capable of performing the functions described within this specification.

Memory elements 110 can include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard drive or other persistent data storage device. System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other systems, computer systems, remote printers, and/or remote storage devices through intervening private or public networks. Modems, cable modems, and Ethernet cards are examples of different types of network adapters that can be used with system 100.

As pictured in FIG. 1, memory elements 110 can store an application 140. Application 140, when executed, causes system 100 to perform the various processing steps described within this specification. For example, application 140 can be a CAD application, a compression application that operates cooperatively with another application or system, or the like. Responsive to executing application 140, system 100 can perform the compression processing described herein with reference to the remaining figures upon uncompressed GM data 145 and output compressed GM data 150 to memory elements 110.

For example, processor 105 can execute application 140 and output compressed GM 150 data to bulk storage device 125 or other bulk storage devices external to system 100. Processor 105 can execute application 140 and output at least partially decoded, e.g., partially uncompressed, GM data (not shown) to local memory 120 to reduce the time needed to decode GM data during runtime of application 140 or another application that utilizes the GM data during runtime. As used herein, "outputting" and/or "output" can mean storing in memory elements 110, for example, writing to a file stored in memory elements 110, writing to display 135 or other peripheral output device, sending or transmitting to another system, exporting, or the like.

The one or more embodiments described within this specification, as performed by a system such as system 100 of FIG. 1, can provide significantly more compression than is attainable using conventional techniques such as ZIP type compression. For example, the uncompressed GM data for a single programmable IC for use with a CAD system can be approximately as large as 217.5 MB in size. After application of ZIP compression, the GM data can be reduced to about 49 MB for a compression ratio of approximately 4.4×(217.5/49). Applying the techniques described within this specification, the 217.5 MB of GM data can be reduced to about only 11.7 MB for a compression ratio of approximately 18.6×(217.5/11.7).

Application of the techniques described within this specification does not preclude the additional use of other conventional compression techniques. For example, the 11.7 MB file can be further reduced through application of ZIP compression to about only 1.42 MB in size for a further compression of approximately 8.2×(11.7/1.42). The resulting compression ratio is more than approximately 150×, e.g., 217.5/1.42. Moreover, application of the techniques described within this specification prior to application of a conventional compression technique allows the conventional compression technique such as, e.g., ZIP, to generate larger compression ratios than otherwise would have been possible, e.g., 8.2× versus 4.4× in the above example. For example, application of ZIP compression to GM data first compressed as described within this specification can result in a compression ratio of approximately 61×, whereas application of ZIP compression to the uncompressed GM data typically results in a compression ratio of only about 4×.

In another example, the uncompressed GM data for multiple programmable ICs for use with a CAD system can be approximately 3,800 MB. After application of ZIP compression, the GM data can be reduced to about 924 MB for a compression ratio of approximately 4.1×. Applying the techniques described within this specification, the 3,800 MB of GM data can be reduced to about 377 MB for a compression ratio of approximately 10×(3,800/377). Subsequent Further application of ZIP compression can reduce the GM data to about 62 MB for a further compression ratio of approximately 6.1×(377/62). The resulting, e.g., total, compression ratio is more than approximately 61×(3800/62).

Figure 2:
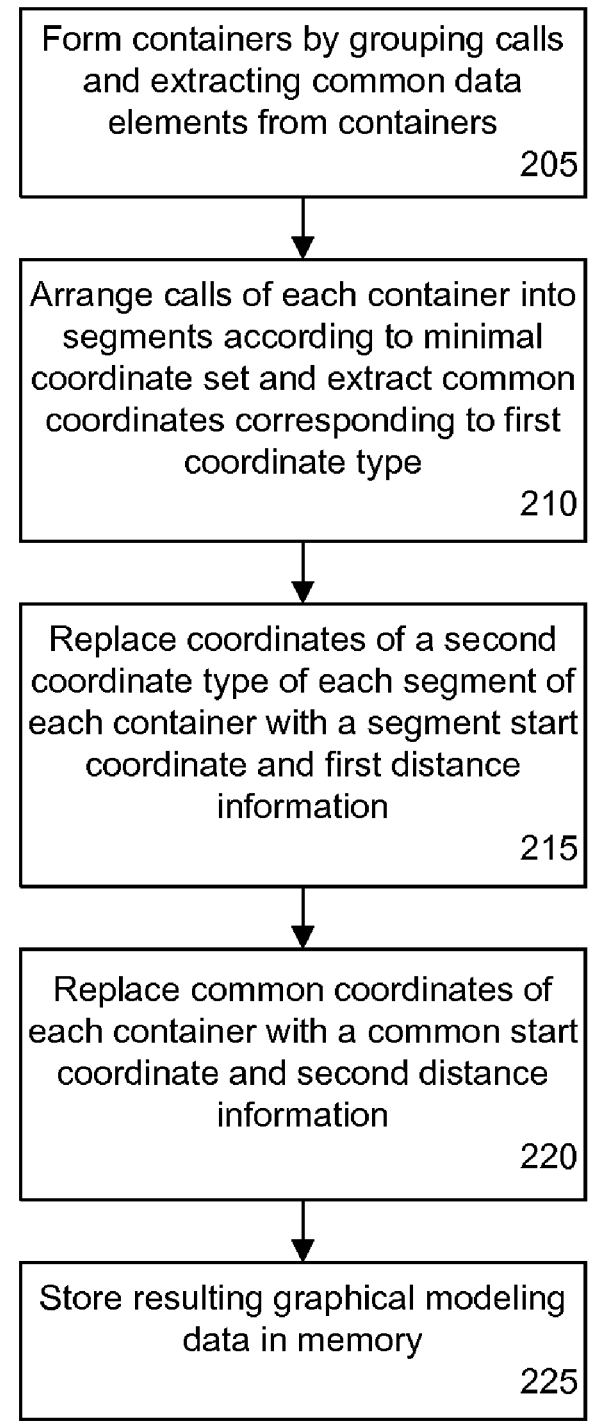
FIG. 2 is a first flow chart illustrating a method of compressing GM data in accordance with another embodiment of the present invention.

FIG. 2 is a first flow chart illustrating a method 200 of compressing GM data in accordance with another embodiment of the present invention. Method 200 can be performed by the system described with reference to FIG. 1. Method 200 can begin in a state where uncompressed GM data is stored within memory. As noted, the GM data can include a macro library and call data.

In step 205, the system can form containers from the GM data. The system can form containers by grouping calls and then extracting common data elements. The calls can be grouped into containers according to one or more data elements specified within each call. As such, a "container" can refer to a group of one or more calls that have one or more same data elements in common. For example, since each call instantiates a selected macro from the macro library, each call specifies a macro identifier that uniquely identifies or references the macro that is being instantiated by the call. Additionally, each call can include one or more flag bits within a header portion of the call. The calls can be grouped into containers according to macro identifiers, flag bits (header), or both macro identifiers and flag bits.

Common data elements that can be removed from each call can include the macro identifier, the header that includes the flag bits, or both. In general, each data element used to organize the containers is common to each call of a container and, therefore, can be extracted from each call of the container. On a per container basis, such data elements need only be stored or represented one time for the container rather than being duplicated across each call within the container.

In step 210, the system can arrange the calls within each container into segments and extract common coordinates corresponding to a first coordinate type from the segments. In one aspect, GM data can be two-dimensional. Two-dimensional GM data can include x-coordinate and y-coordinate pairs. In that case, segments can refer to rows parallel to the x-axis and columns parallel to the y-axis. In another aspect, GM data can be three-dimensional. Three-dimensional GM data can include both x-coordinates and y-coordinates, and also z-coordinates. In the case of three-dimensional GM data, a segment can refer to rows or columns as described with reference to two-dimensional data and also rows that are parallel to the z-axis.

For purposes of illustration, two-dimensional GM data will be used throughout this specification. The embodiments disclosed, however, are not intended to be limited solely to two dimensional GM data or three-dimensional GM data. Rather, the embodiments disclosed within this specification can be applied to "N"-dimensional data, where "N" is an integer value.

In step 210, the system can determine a minimal coordinate set. The minimal coordinate set is determined for each container. In the case of two-dimensional GM data, a coordinate set can refer to the number of unique values for a given coordinate type, where type refers to the axis to which the coordinate corresponds, e.g., x or y. The minimal coordinate set refers to the coordinate set with the fewest unique values. In general, when the system determines that the minimal coordinate set is composed of x-coordinates for a given container, the calls of the container can be arranged in columns. The calls can be arranged into column type segments where each column includes calls having a same x-coordinate value. When the system determines that the minimal coordinate set is composed of y-coordinates for the container, the calls of the container can be arranged into rows. The calls can be arranged into row type segments where each row includes calls having a same y-coordinate value.

The system can extract a common data element from each segment. Since the calls within each respective segment of a container will include a common coordinate type, e.g., either a common x-coordinate value when arranged in columns or a common y-coordinate value when arranged in rows as the case may be, that common value of the selected coordinate type can be extracted from each segment. The extracted common values, e.g., the common coordinates, are coordinates of the coordinate type of the minimal coordinate set. For each segment, such coordinate values need only be stored or represented one time rather than being redundantly stored for each call within the segment.

In step 215, the system can replace coordinates of a second coordinate type of each segment of the at least one container with a segment start coordinate and first distance information specifying the coordinates of the second coordinate type. For each segment of each container, the system can determine a segment start coordinate of the non-extracted coordinates of the second coordinate type. Further, for each segment, the system can determine distance information, as will be described within this specification in greater detail. In general, the first distance information can specify the distance between consecutive call pairs within a segment. More particularly, the first distance information of an entry can specify the distance between consecutive ones of the non-extracted, second coordinate types from a segment. An entry specifying the distance information as stored within a distance table can be determined and stored in the form of an index within the container in lieu of the second coordinate types.

For example, when the x-coordinates of a particular segment are extracted leaving y-coordinates within the segment as the second type of coordinate, the remaining (non-extracted) y-coordinate values can be ordered lowest to highest. The segment start coordinate can be the lowest y-coordinate value. The entry in the distance table can be specified in the form of a distance vector. The distance vector specifies spacing between the ordered y-coordinates of the segment. Thus, the (x, y) coordinate pairs of a segment can be reconstructed given the extracted x-coordinate value of a segment, stored segment start coordinate of the y-coordinates of the segment, in combination with the distance vector. In another example, rather than storing a distance vector as distance information, a distance code can be stored that is derived from the distance vector. The distance code can be derived by run length encoding the distance vector.

In step 220, the system can replace the common coordinates of each container with a common start coordinate and second distance information. The system can apply a similar process as described with reference to step 215 to the extracted common coordinates and represent the extracted common coordinates for each container in the form of a common start coordinate and an index specifying an entry in the distance table storing second distance information. The distance information specifies the distance between consecutive ones of the common coordinate values when ordered lowest to highest. As noted with respect to step 215, the distance information can be stored in the form of a distance vector or a distance code.

In step 225, the resulting GM data can be stored in memory. More particularly, the GM data including the containers can be stored in memory. For example, the GM data can be stored within a bulk storage device. The size of the GM data after processing described with reference to FIG. 2 can be significantly smaller than the original size prior to compression as will be demonstrated with reference to the remaining figures.

Figures 3, 4:
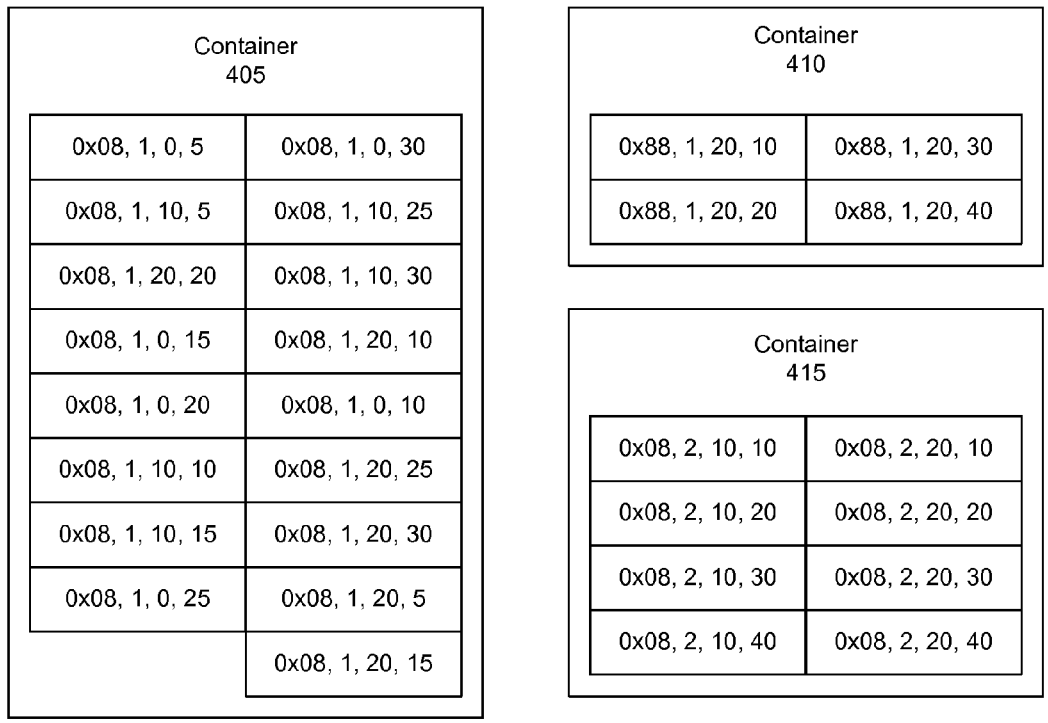
FIG. 3 is a first table illustrating a plurality of calls of uncompressed GM data in accordance with another embodiment of the present invention.
FIG. 4 is a second block diagram illustrating the formation of containers in accordance with another embodiment of the present invention.

FIG. 3 is a first table 300 illustrating a plurality of calls of uncompressed GM data in accordance with another embodiment of the present invention. As shown, each call includes four data elements. The first data element is an eight bit (one byte) hexadecimal header. The header includes one or more flag bits specifying various implementation options for the macro being instantiated. Within the calls illustrated in FIG. 3, the headers are "0x08" and "0x88." The second data element in each call is a 32-bit (four byte) macro identifier specifying the particular macro to be instantiated by the call. Within the calls illustrated in FIG. 3, the macro identifiers are "1" and "2." The next, or last, two values in each call are a 32-bit (four byte) unsigned integer specifying an x-coordinate value and a 32-bit (four byte) unsigned integer specifying a y-coordinate value.

For purposes of illustration, consider the call "0x08, 1, 0, 5". This call, as is each call illustrated within FIG. 3, is 13 bytes in size. The call "0x08, 1, 0, 5" includes a header byte of "0x08," a macro identifier of "1," an x-coordinate of "0," and a y-coordinate of "5." Thus, execution of call "0x08, 1, 0, 5" instantiates the macro corresponding to the macro identifier "1" at the location specified by the (x, y) coordinate pair (0, 5) using any control settings associated with the header "0x08."

FIG. 4 is a second block diagram illustrating the formation of containers in accordance with another embodiment of the present invention. FIG. 4 shows the calls illustrated in FIG. 3 being grouped into a plurality of containers. In the example illustrated in FIG. 4, the calls are grouped into three containers 405, 410, and 415. The grouping of calls into containers can be performed according to values specified by one or more of the data elements within each call. For example, the macro identifier data element, the header data element, or a combination of both the macro identifier and header data elements can be used to organize calls into containers.

FIG. 4 illustrates an embodiment in which both the macro identifiers and the headers are used to group calls into containers. Accordingly, as shown, container 405 includes each call that includes a header of "0x08" and a macro identifier of "1." Container 410 includes each call that includes a header byte of "0x88" and a macro identifier of "1." Container 415 includes each call that includes a header byte of "0x08" and a macro identifier of "2."

FIG. 5 is a second table illustrating container processing in accordance with another embodiment of the present invention. FIG. 5 illustrates that, within each container, selected data elements common to each call of the container can be removed and need not be stored redundantly across each call of the container. More particularly, the header and the macro identifier can be extracted from each individual call. The header and the macro identifier, being the same within a selected container, need only be stored one time as opposed to being stored redundantly for each call within each container.

Thus, container 405 illustrates that the header "0x08" and the 32-bit macro identifier "1" are stored one time for the entire container 405. The header and the macro identifier are not duplicated and stored repetitively for each individual call within container 405. Accordingly, after the header and the macro identifier, container 405 need only include a list of (x, y) coordinate pairs. A same procedure can be followed with regard to both containers 410 and 415, e.g., each other container.

FIG. 5 illustrates that for a given container such as container 405, the size of the container can be reduced significantly. Prior to organization into containers, the 17 calls of container 405 require 221 bytes. Recall that each call is 13 bytes in size. Thus, 13 bytes times 17 calls results in 221 bytes. Subsequent to the container processing described with reference to FIGS. 3-5, container 405 is reduced to only 141 bytes. Recall that each (x, y) coordinate pair requires 64-bits (eight bytes), that the header requires one byte, and that the macro identifier requires 32-bits (four bytes).

Figures 6, 7:
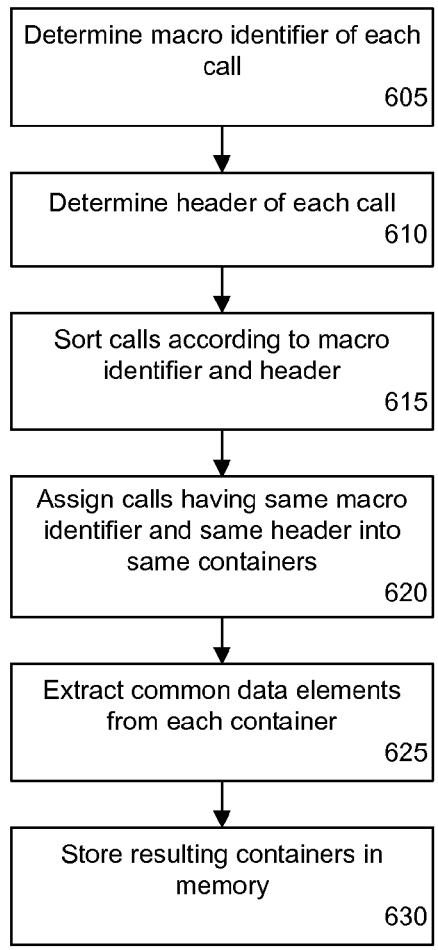
FIG. 6 is a second flow chart illustrating a method of forming containers by grouping calls and extracting common data elements in accordance with another embodiment of the present invention.
FIG. 7 is a third table illustrating unique coordinate sets for a selected container of GM data in accordance with another embodiment of the present invention.

FIG. 6 is a second flow chart illustrating a method of forming containers by grouping calls and extracting common data elements in accordance with another embodiment of the present invention. FIG. 6 illustrates one technique for performing step 205 of FIG. 2 with reference to FIGS. 3-5 as described herein.

Accordingly, in step 605, the system can determine the macro identifier for each call of the GM data. In step 610, the system can determine the header, or at least the relevant bit flag or flags specified within each header of each call. In step 615, the calls can be sorted according to the macro identifier and the header within each call. It should be appreciated that in some cases, only one or more particular bits of the header are of interest. Accordingly, any other bits of the header can be masked out or otherwise ignored. Thus, for purposes of sorting calls according to the header and determining whether two calls have matching headers, the entire header or only those bit(s) of interest can be compared.

In step 620, the calls having matching, or same, macro identifiers and headers (or portions of the header), can be assigned to the same container as illustrated in FIG. 4. In step 625, for each container, the data elements that are common to each call of the container can be extracted. The extracted data elements, e.g., the header and the macro identifier, can be stored one time for the container. Thus, only (x, y) coordinate pairs need be stored for each call of the container. In step 630, the resulting containers can be stored in memory.

FIG. 7 is a third table 700 illustrating unique coordinate sets for a selected container of GM data in accordance with another embodiment of the present invention. More particularly, table 700 illustrates the unique coordinate sets for both the x-coordinates and the y-coordinates for container 405 as illustrated within FIG. 5. The system analyzes, on a per container basis, the x-coordinates and the y-coordinates of each call to determine unique values for the x-coordinate and the y-coordinate. Once identified, the system identifies the coordinate type, or set, that includes the fewest members. In this example, the unique set of x-coordinates includes the fewest members. The particular unique coordinate set having the fewest members is identified as the minimal coordinate set. Thus, within FIG. 7, since the unique coordinate set of x-coordinates includes three members and the unique coordinate set of y-coordinates includes six members, the system determines that the unique coordinate set for the x-coordinate is the minimal coordinate set.

Figure 8:
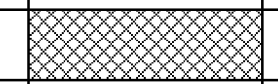
FIG. 8 is a third block diagram illustrating the processing of containers into segments according to a minimal coordinate set in accordance with another embodiment of the present invention.

FIG. 8 is a third block diagram illustrating the processing of containers into segments according to a minimal coordinate set in accordance with another embodiment of the present invention. Recall that when the x-coordinate set is determined to be the minimal coordinate set for a given container, the calls of the container can be arranged in columns. The calls can be arranged into column type segments where each column includes calls having a same x-coordinate value. When the y-coordinate set is determined to be the minimal coordinate set, the calls of the container can be arranged into rows. The calls can be arranged into row type segments where each row includes calls having a same y-coordinate value.

In this example, referring to FIG. 8, container 405 is arranged into columns. The number of segments formed is the same as the number of elements in the minimal coordinate set. Thus, three columns corresponding to unique x-coordinate values of "0, 10, 20" of the minimal coordinate set are formed. As shown, each (x, y) coordinate pair having an x-coordinate of "0" is in the first column. Each (x, y) coordinate pair having an x-coordinate of "10" is in the second column. Each (x, y) coordinate pair having an x-coordinate of "20" is in the third column. The process illustrated in FIG. 8 can be performed for each container.

Figure 9:
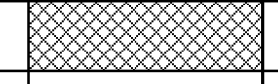
FIG. 9 is a fourth block diagram illustrating further processing of containers in accordance with another embodiment of the present invention.

FIG. 9 is a fourth block diagram illustrating further processing of containers in accordance with another embodiment of the present invention. FIG. 9 illustrates that another common data element can be extracted from each respective segment formed within a container. FIG. 9 illustrates that, for each of the three columns presented for container 405, the common data element, in this case the x-coordinate value of each respective column, has been extracted. The "0" x-coordinate value is extracted from the first column. The "10" x-coordinate value is extracted from the second column. The "20" x-coordinate value is extracted from the third column. Within each segment, the calls are ordered according to the coordinate that is not extracted. For example, within each column, the remaining calls are ordered, or sorted, according to the y-coordinates in increasing order.

In addition to the header and the macro identifier, a configuration byte can be added that indicates whether the segment type of the container is a row or a column. Thus, the configuration byte indicates whether the calls of the container, e.g., container 405, are arranged in rows or columns. In the example of FIG. 9, the "0" value for the configuration byte indicates that the calls of container 405 are arranged in columns. The extracted x-coordinate values of "0, 10, 20" need only be stored one time for the container rather than within each of the constituent calls. The container organization illustrated in FIG. 9 shows that the 141 bytes needed to store container 405 as illustrated in FIGS. 5 and 8 can be further reduced to 86 bytes. Container 405 includes 17 y-coordinates with each being four bytes in size, a single header byte, a four byte macro identifier, a single configuration byte, and three common x-coordinates each being four bytes in size.

Figure 10:
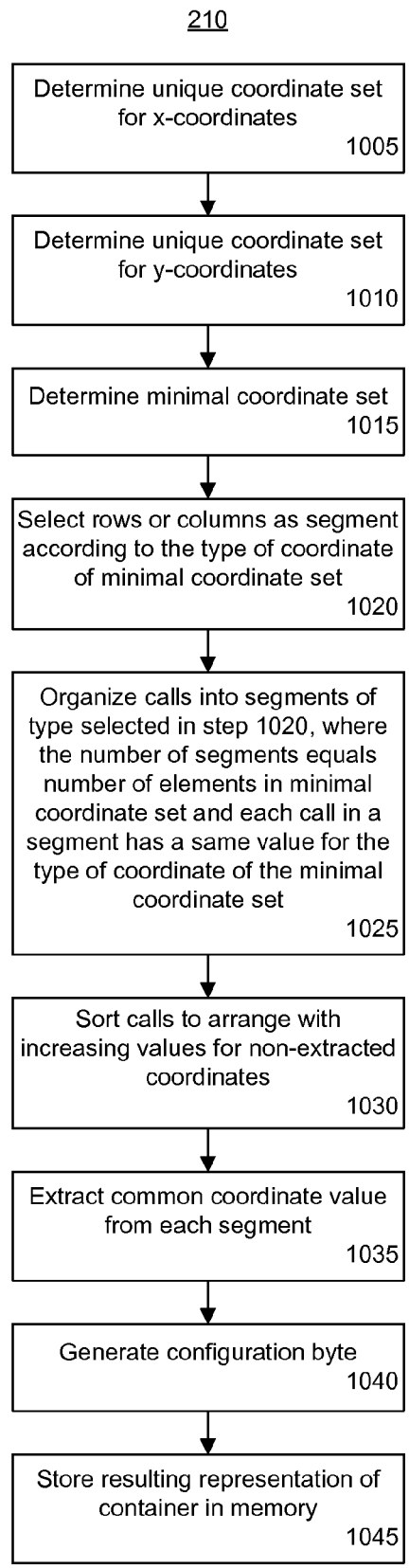
FIG. 10 is a third flow chart illustrating a method of arranging containers into segments in accordance with another embodiment of the present invention.

FIG. 10 is a third flow chart illustrating a method of arranging containers into segments in accordance with another embodiment of the present invention. More particularly, FIG. 10 illustrates a technique for performing step 210 of FIG. 2 as illustrated with reference to FIGS. 7-9 as described within this specification. The processing steps described in FIG. 10 are described with reference to a single, e.g., a selected, container. It should be appreciated that the method illustrated in FIG. 10 can be performed for each container of the GM data.

Accordingly, in step 1005, the system can determine a unique coordinate set for the x-coordinates of the calls of the container. In step 1010, the system can determine a unique coordinate set for the y-coordinates of the calls of the container. In step 1015, the system can determine the minimal coordinate set. For example, the system can compare the number of elements within the unique coordinate set for the x-coordinates and the number of elements within the unique coordinate set for the y-coordinates and select the unique coordinate set having the fewest number of elements as the minimal coordinate set.

In step 1020, rows or columns can be selected as the segment type according to the type, e.g., either x-coordinates or y-coordinates, selected as the minimal coordinate set. As noted, when the minimal coordinate set is formed of x-coordinates, columns are selected as the segment type. When the minimal coordinate set is formed of y-coordinates, rows are selected as the segment type.

In step 1025, the calls of the container can be organized into segments of the type selected in step 1020. The number of segments is equal to the number of elements in the minimal coordinate set. Further, each call in a segment can have a same value for the type of coordinate of the minimal coordinate set. For example, if the minimal coordinate set is formed of x-coordinates, then each call within a column type of segment will have a same x-coordinate.

In step 1030, within each column, the system can sort calls so that the calls are ordered within each column with increasing y-coordinates. When the minimal coordinate set is formed of y-coordinates, then each call within a row will have a same y-coordinate value. Within each row, calls can be sorted so that calls are ordered within each row with increasing x-coordinates.

In step 1035, the system can extract the common coordinate value for each segment of the container. Thus, when the segments type is a column, the x-coordinate value that is common among calls for each segment can be extracted. The extracted coordinate values need only be stored one time for the container as opposed to being redundantly stored within a plurality of calls on a per segment basis. In step 1040, the system can generate the configuration byte within the container that indicates whether the segment type within the container is either a column or a row. In step 1045, the system can store the resulting representation of the container in memory.

Figures 11, 12:
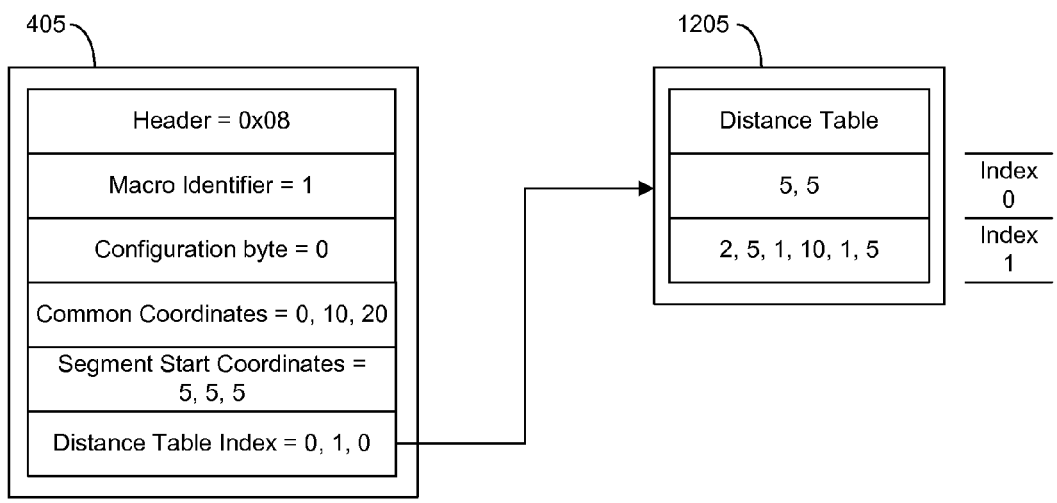
FIG. 11 is a fifth block diagram illustrating the determination of distance information for segments of a container in accordance with another embodiment of the present invention.
FIG. 12 is a sixth block diagram illustrating the use of a distance table in accordance with another embodiment of the present invention.

FIG. 11 is a fifth block diagram illustrating the determination of distance information for segments of a container in accordance with another embodiment of the present invention. FIG. 11 illustrates application of distance information to the column type segments of container 405. The use of distance information leverages the likelihood that the GM data includes coordinates arranged in a grid-like pattern that are often equidistant from one another. This grid-like characteristic of the calls of the GM data allows a plurality of coordinates to be represented using a start value in combination with distance information such as a distance vector or a distance code.

Recall that after extraction of the common x-coordinate values from the three column type segments of container 405, as illustrated in FIG. 9, columns of y-coordinates remain in container 405. FIG. 11 illustrates the y-coordinates for columns 1, 2, and 3 and the distance information that the system can generate to represent the y-coordinates. As shown, the system can calculate a distance vector for each of the columns. In general, a distance vector specifies a distance between consecutive coordinate locations within a specified segment. In this example, the vectors specify the distance between two consecutive coordinate locations within a column when arranged in increasing order according to the remaining, e.g., the non-extracted, coordinate which is the y-coordinate in this case.

For example, referring to column 1, the first coordinate is (0, 5). The common coordinate value for each y-coordinate, as shown, is zero, e.g., an x-coordinate value of zero. The start y-coordinate, e.g., the smallest y-coordinate or first y-coordinate after sorting the y-coordinates of column 1 in increasing order, is "5". Thus, the value of "5" is stored as the segment starting coordinate for column 1. Presuming that column 1 includes "N" remaining coordinates, wherein "N" is an integer value, the distance vector includes "N−1" values. The distance vector specifies the distance between each consecutive pair of y-coordinates. Thus, referring to column 1, the distance vector is determined and formed by solving the following expressions: 10−5=5; 15−10=5; 20−15=5; 25−20=5; 30−25=5. The distance vector is {5, 5, 5, 5, 5} representing the distance between each consecutive pair of y-coordinates shown in FIG. 11 for column 1.

Accordingly, given the segment start coordinate of any segment, e.g., the y-coordinate of "5" in this case for column 1, each of the y-coordinates of that segment can be determined or recovered using the distance vector for column 1 as applied to the segment start coordinate. The segment start coordinate for each segment can be stored within the container, e.g., container 405 as shown.

In one embodiment, the system can determine the distance code of column 1 by applying run length encoding (RLE) to the distance vector. In general, RLE refers to a technique in which runs of data, in reference to sequences in which the same data value occurs in many consecutive data elements, are stored as a single data value and count, rather than as the original sequence. Typically, the distance vector contains many repetitive values. Thus, when the system applies RLE to the distance vector, typically a distance code is generated that is smaller in size than the original distance vector, thereby resulting in further data compression. The distance code can be formed using one or more pairs formed of a one byte count and a three byte distance value.

Continuing with column 1, the distance vector {5, 5, 5, 5, 5} can be represented by the distance code {5, 5} where the first value "5" is the one byte count indicating the number of instances of the next value. The second value of the distance code is the three byte distance value specifying the particular number, or value, that is repeated according to the count. Thus, the distance code {5, 5} refers to the value "5" being repeated five times, e.g., five instances of the value five, as illustrated by the distance vector.

The system can determine a distance vector and a distance code for each segment of each container. FIG. 11 illustrates the distance vectors and distance codes for each of columns 1-3 of container 405. Thus, referring to column 2, the distance vector {5, 5, 10, 5} is derived by taking a difference between the following consecutive y-coordinate value pairs: 10−5=5; 15−10=5; 25−15=10; 30−25=5. Applying RLE to the distance vector {5, 5, 10, 5}, the system generates a distance code of {2, 5, 1, 10, 1, 5}. The distance code specifies that there are two instances of "5" followed by one instance of "10" followed by one instance of "5". The distance code for column 2 illustrates that the distance code, in some cases, can be longer than the original distance vector. Referring to column 3, the distance vector {5, 5, 5, 5, 5} is derived by taking a difference between the following consecutive y-coordinate value pairs: 10−5=5; 15−10=5; 20−15=5; 25−20=5; 30−25=5. Applying RLE to the distance vector {5, 5, 5, 5, 5} yields a distance code of {5, 5}. As shown, the segment start coordinate of both columns 2 and 3 is "5".

FIG. 11 illustrates that each column can be represented by the segment start coordinate specifying the start y-coordinate of each segment, a common value for each segment, and a distance vector or a distance code for each segment. This allows each of the y-coordinate values for each segment to be represented via the combination of the segment start coordinate and distance information. Other information such as the header, the macro identifier, and the configuration byte as illustrated with respect to FIG. 9 still are included for representing a container, but not shown. It should be appreciated that when the segment type of a container is a row, the segment start coordinates of the container will be x-coordinate values.

FIG. 12 is a sixth block diagram illustrating the use of a distance table in accordance with another embodiment of the present invention. In accordance with the inventive arrangements disclosed herein, the system can create and maintain a distance table 1205. Distance table 1205 can store a plurality of entries. Each entry can include distance information such as a distance vector or a distance code. In one embodiment, distance table 1205 can include only distance vectors. In another embodiment, distance table 1205 can include only distance codes. In still another embodiment, distance table 1205 can store the smaller of the distance vector or the corresponding distance code resulting in distance table 1205 storing both distance vectors and distance codes. Storage of a distance vector or a distance code as an entry can be determined by the system on a per entry basis.

For example, in one embodiment, distance table 1205 can be formed of a plurality of entries, where each entry specifies one distance vector that is unique within distance table 1205. In another embodiment, distance table 1205 can be formed of a plurality of entries, where each entry specifies either a distance vector or a distance code. In that case, the system can determine which of the distance vector or the distance code for a given segment of a container is smaller or requires less memory for storage. Accordingly, the smaller of the two is stored as an entry with an indication that specifies whether the entry is a distance vector or a distance code for purposes of decoding. Still, each entry is unique in that a particular distance vector or distance code is stored only one time, e.g., in one entry, within distance table 1205.

As noted, distance table 1205 can be configured to store only unique entries. Thus, each entry specifies either a unique distance vector or a unique distance code depending upon the implementation of distance table 1205. By storing only unique entries and avoiding duplication, the size of distance table 1205 can be kept to a minimum. In illustration, since columns 1 and 3 of container 405 have same distance vectors and distance codes, the distance information for columns 1 and 3 can be represented using one entry within distance table 1205, e.g., the entry with an index of 0. The distance information for column 2 is represented by the entry within distance table 1205 at index 1.

Distance table 1205 can be a global distance table in that one distance table can be used for all segments of the GM data. Thus, despite one container having column type segments and another container having row type segments, the same distance table can be used for purposes of representing distance information among locations in a same segment. The fact that some containers are arranged into rows and others are arranged into columns is irrelevant for purposes of storing the distance information since the configuration byte of each respective container specifies how to decode the distance information on a per container basis. In any case, due to the grid-like nature of the GM data and the likelihood of duplication with respect to distance vectors and distance codes, maintaining a single global distance table reduces the amount of data that needs be stored and duplicated across container segments.

In one embodiment, distance table 1205 can be implemented using a fixed one byte count and a three byte distance value pair. In another embodiment, the distance value can be made variable between, for example, one and eight bytes. Making the distance value variable allows the system to utilize additional flag bits, e.g., three, to indicate the number of bytes used for the distance value.

As shown in FIG. 12, a representation of container 405 is shown in which distance information is no longer included within the representation of container 405. Rather, the distance information is replaced by a plurality of indexes into distance table 1205. As shown, container 405 includes distance code indexes "0," "1," and "0." Using indexes allows the system to represent the y-coordinates from each of columns 1-3 illustrated in FIG. 11 by reference to the segment start coordinate of each respective column and a corresponding index into distance table 1205 specifying distance information in the form of a distance vector or a distance code, from which the y-coordinates can be recovered through decoding and reversing the various process steps described within this specification.

Use of distance table 1205 allows all locations of a given segment of a container, whether a row or a column, to be represented using a four byte common coordinate, a four byte start coordinate, and a two byte index into the distance table. The representation illustrated in FIG. 12 utilizes 36 bytes, resulting in further compression of container 405 from the 86 bytes required for the representation of container 405 shown in FIG. 9. Referring to FIG. 12, the header requires one byte, the macro identifier requires four bytes, the configuration byte is implemented as one byte, the common values require four bytes each (12 bytes), the start coordinates require four bytes each (12 bytes), and the distance code indexes require two bytes each (six bytes). Additional space is required for storage of distance table 1205. Storage of distance table 1205, however, still results in a reduction of storage space, particularly as the size of the GM data grows.

Figure 13:
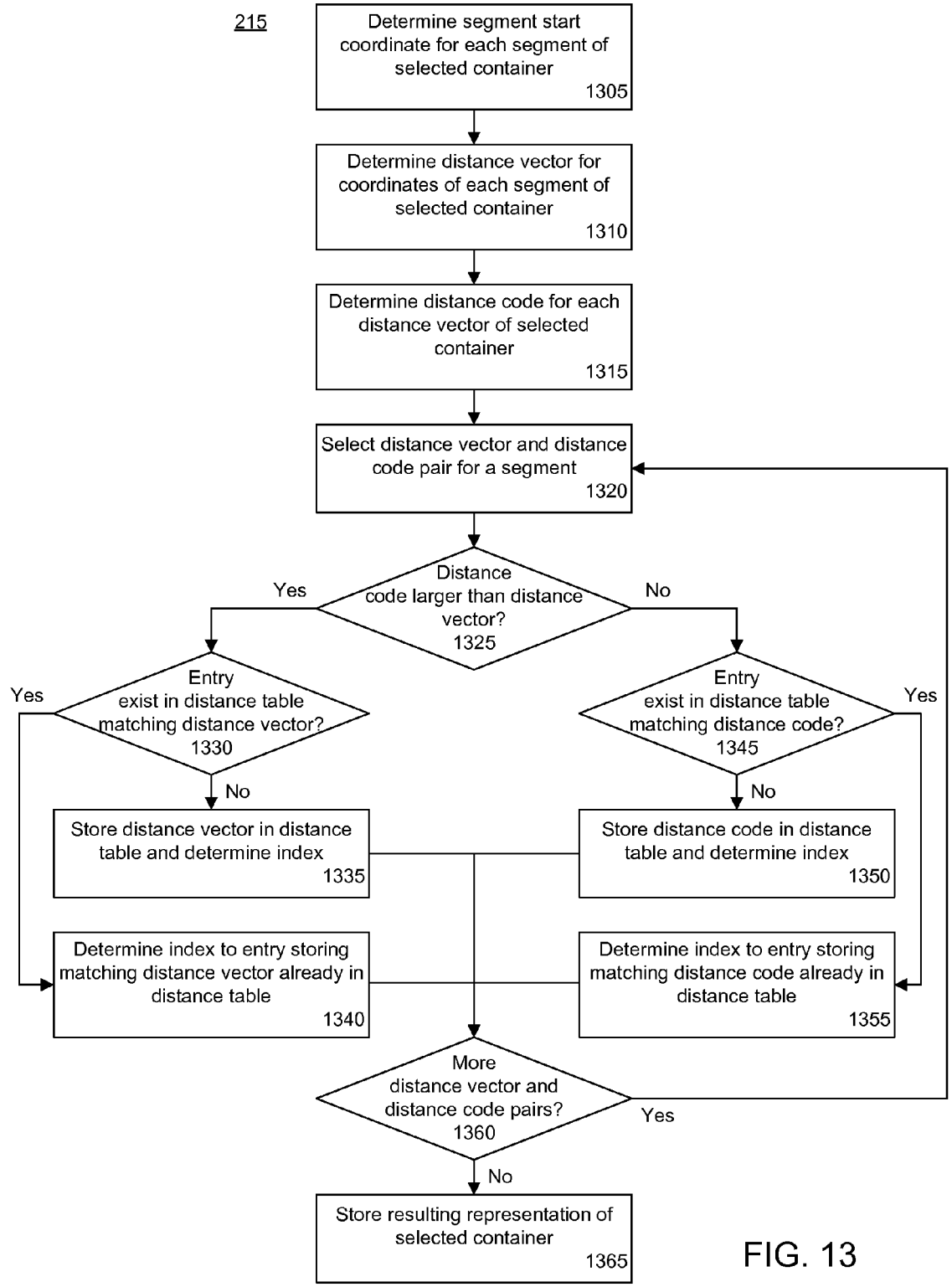
FIG. 13 is a fourth flow chart illustrating a method of applying distance information to the GM data in accordance with another embodiment of the present invention.

FIG. 13 is a fourth flow chart illustrating a method of applying distance information to the GM data in accordance with another embodiment of the present invention. More particularly, FIG. 13 illustrates a technique for performing step 215 of FIG. 2 as illustrated with reference to FIGS. 11 and 12 within this specification. FIG. 13 begins in a state following the implementation of step 1045 of FIG. 10, where calls of the container are organized into segments of a particular type, e.g., columns in this example, and sorted in increasing order. Like FIG. 10, FIG. 13 is described with reference to a single, e.g., a selected, container. It should be appreciated that the method illustrated in FIG. 13 can be performed for each container of the GM data.

Accordingly, in step 1305, for each segment of the selected container, the system can determine a segment start coordinate. The segment start coordinate indicates the lowest of the remaining, or non-extracted, coordinates, e.g., the lowest value of the second coordinate type still remaining within each segment. When the segment is a column, the segment start coordinate for each column is the first, e.g., the lowest, y-coordinate value of all y-coordinates in the column. As noted, the coordinates can remain sorted from lowest to highest. When the segment is a row, the segment start coordinate for each row is the first, e.g., the lowest, x-coordinate value of all x-coordinates in the row. Again, the coordinates can remain sorted from lowest to highest.

Beginning in step 1310, the system can start determining first distance information for each segment of the container. In step 1310, the system can determine a distance vector for the non-extracted coordinates of each segment of the selected container. Referring to FIG. 10, for example, the distance vector can be calculated according to the consecutive y-coordinate pairs for each column of the container. In step 1315, the system can continue determining first distance information. More particularly, in step 1315, the system can determine a distance code for each distance vector of the selected container. For example, the system can perform RLE upon each distance vector of the container to determine a corresponding distance code.

In step 1320, a distance vector and corresponding distance code (vector code pair) can be selected. As discussed, in one embodiment, the smaller of the distance vector and the corresponding distance code of a vector code pair can be stored within the distance table. In step 1325, the system can compare the amount of memory required to store the distance vector, e.g., the size, with the amount of memory required to store the distance code of the vector code pair. The system can determine whether the distance code is larger than the distance vector. When the distance code is larger than the distance vector, the method can continue to step 1330. When the distance vector is larger than the distance code, the method can proceed to step 1345.

Proceeding with step 1330, where the system has determined that the distance vector is smaller than the distance code, the system can determine whether an entry exists in the distance table that specifies a distance vector matching the distance vector of the selected vector code pair. When the system determines that the distance vector is smaller than the distance code, the RLE applied to the distance vector was unsuccessful in reducing the size of the distance information. Accordingly, the system can store the smaller sized distance vector as an entry within the distance table.

As noted, only unique entries are stored within the distance table. Thus, when the system determines that the distance table does not include an entry that specifies a distance vector matching the distance vector of the selected vector code pair, the method can proceed to step 1335. When the system determines that the distance table already includes an entry that specifies a distance vector matching the distance vector of the selected vector code pair, the method can continue to step 1340.

In step 1335, the system can store the distance vector of the selected vector code pair within the distance table as an entry. The system can store or create, within the entry, an indicator specifying that the entry stores a distance vector as opposed to a distance code. The index into the distance table that specifies the newly stored entry can be determined and stored as part of the container to represent the particular segment being processed. After step 1335, the method can continue to step 1360.

In step 1340, the system can determine the index that indicates the entry of the distance table that specifies a distance vector matching the distance vector of the selected vector code pair. The index can be determined and stored as part of the container to represent the particular segment being processed. After step 1340, the method can proceed to step 1360.

Referring to step 1345, where the system has determined that the distance code of the selected vector code pair is smaller than the distance vector, the system can determine whether an entry exists in the distance table that specifies a distance code that matches the distance code of the selected vector code pair. When the system determines that the distance code is smaller than the distance vector, the RLE applied to the distance vector was successful in reducing the size of the distance information. Accordingly, the system can store the smaller sized distance code within the distance table.

When the system determines that the distance table does not include an entry that specifies a distance code matching the distance code of the selected vector code pair, the method can proceed to step 1350. When the system determines that the distance table already includes an entry that specifies a distance vector matching the distance vector of the selected vector code pair, the method can continue to step 1355.

In step 1350, the system can store the distance code of the selected vector code pair within the distance table as an entry. The system can store or create, within the entry, an indicator specifying that the entry stores a distance code as opposed to a distance vector. The index into the distance table that specifies the newly stored entry can be determined and stored as part of the container to represent the particular segment being processed. After step 1350, the method can continue to step 1360.

In step 1355, the system can determine the index that indicates the entry of the distance table that specifies a distance code matching the distance code of the selected vector code pair. The index can be determined and stored as part of the container to represent the particular segment being processed. After step 1355, the method can proceed to step 1360.

Proceeding to step 1360, the system can determine whether there are further vector code pairs to process. When there are further vector code pairs that require processing, the method can loop back to step 1320 to select a next vector code pair for processing and continue as described. When no further vector code pairs require processing the method can continue to step 1365.

In step 1365, the system can store the resulting representation of the container. The container, after the processing described in FIG. 13, includes indexes to distance vectors or distance codes within the distance table as opposed to coordinates or other distance information. For example, the container can have a form or format as illustrated with respect to FIG. 12.

FIG. 13 describes an embodiment in which the system intelligently determines whether to store a distance vector or a distance code within the distance table. In another embodiment, the system complexity can be reduced in that the system can store only distance vectors or distance codes without performing a comparison of the size of the distance vector with the size of the distance code for each vector code pair.

Figure 14:
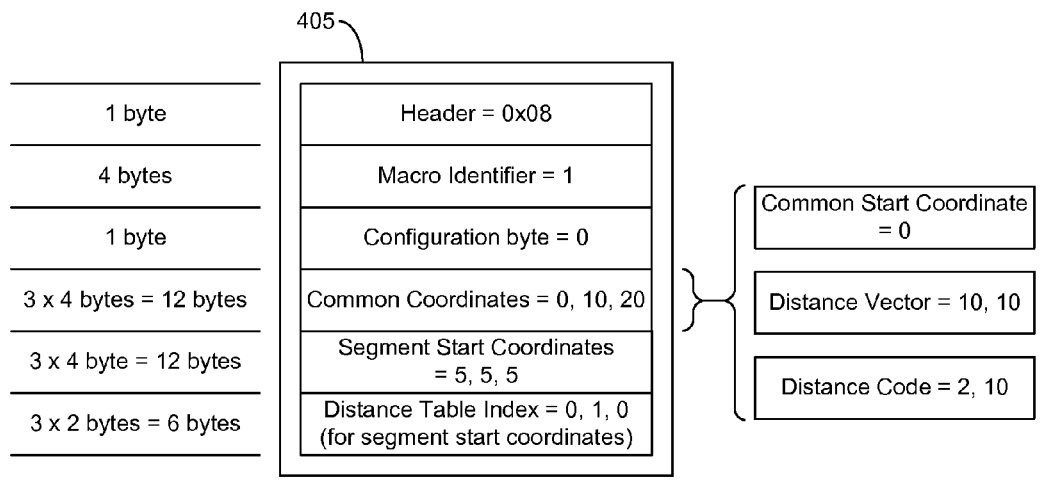
FIG. 14 is a seventh block diagram illustrating further container processing in accordance with another embodiment of the present invention.

FIG. 14 is a seventh block diagram illustrating further container processing in accordance with another embodiment of the present invention. The processing illustrated with reference to FIG. 14 leverages the likelihood that the common coordinates extracted from the segments, in this case columns, are equidistant. The equidistant nature of at least some the extracted coordinates indicates that application of RLE by the system is likely to result in a further reduction in the amount of memory needed to represent a container.

Referring container 405 of FIG. 14, the common coordinates "0, 10, 20" represent the extracted x-coordinate of each of the three segments, in this case columns. These common coordinates can be represented using a process similar to that described with reference to FIG. 13, in that the sequence of common coordinates can be represented using a start coordinate, denoted as the common start coordinate, and distance information. The distance information can be specified in the form of a distance vector or a distance code. The smaller of the distance vector or the distance code can be stored within the distance table. Thus, application of RLE also allows further leverage of the distance table. As such, the same distance information used in representing y-coordinates from the columns of container 405 can be used to represent the common coordinates, e.g., the x-coordinates in this case. Thus, the common coordinates of "0, 10, 20" can be represented by the common start coordinate of "0", a distance vector of {10, 10} or a distance code of {2, 10}.

Figure 15:
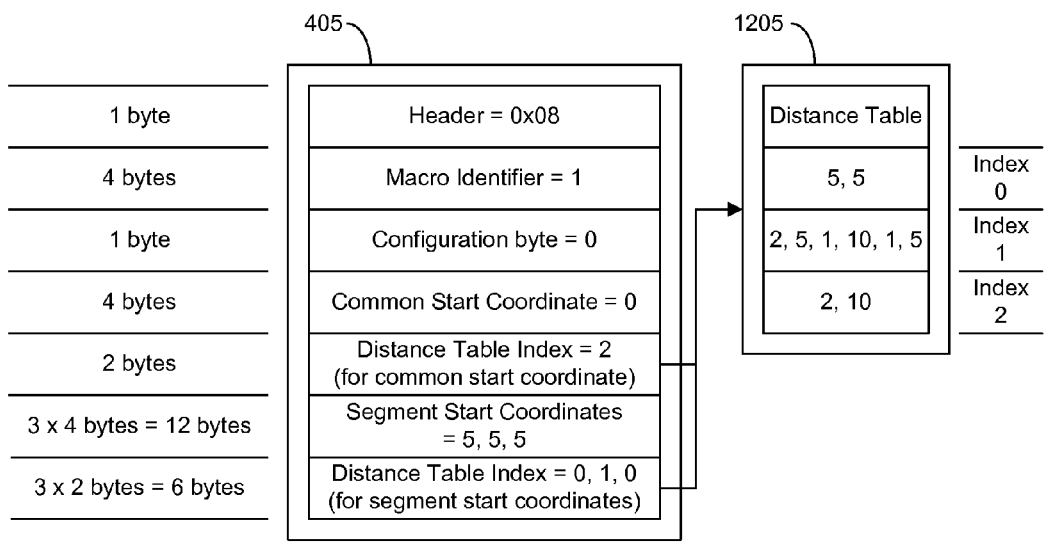
FIG. 15 is an eighth block diagram illustrating the determination of distance information in accordance with another embodiment of the present invention.

FIG. 15 is an eighth block diagram illustrating the determination of distance information in accordance with another embodiment of the present invention. More particularly, FIG. 15 illustrates the format of container 405 after the system transforms the representation of common coordinates "0, 10, 20" into a common start coordinate and a corresponding index into distance table 1205 indicating an entry specifying either a distance vector or a distance code that can be used to recover the common coordinates "0, 10, 20" from the common start coordinate of zero. In this example, the distance code {2, 10}, which is the RLE representation of the distance vector {10, 10} is stored within distance table 1205. Thus, the index stored within container 405 to reconstruct the common coordinates from the common coordinate start of zero is 2, referencing distance code {2, 10}.

FIG. 15 illustrates a scenario in which the distance code is the same size as the distance vector. In such cases, either the distance code or the distance vector can be stored within distance table 1205 depending upon design preference. In one or more embodiments in which only distance codes are stored regardless of whether the distance code is larger than the distance vector, the distance code can be stored.

Application of distance coding to the common coordinates results in a further reduction in size of container 405. For example, after the processing described with reference to FIG. 15, container 405 is reduced from a size of 36 bytes as represented in FIG. 14, to a size of 30 bytes. Referring to FIG. 15, the header requires one byte, the macro identifier requires four bytes, and the configuration byte is implemented as one byte. Whereas the common coordinates required 12 bytes in FIG. 14, the common coordinates can be represented by a common start coordinate of four bytes and a two byte index into the distance table, e.g., 6 bytes. The segment start coordinates require four bytes each (12 bytes), and the distance code indexes require two bytes each (6 bytes).

It should be appreciated that the reduction in size of a container achieved by application of the techniques described with reference to FIGS. 14 and 15 can be significantly larger than illustrated. The more significant reduction in size can result from the fact that actual GM data likely includes many more common coordinates. Thus, application of RLE as illustrated likely results in a correspondingly larger reduction in the amount of memory needed for each container to represent common coordinates.

Figure 16:
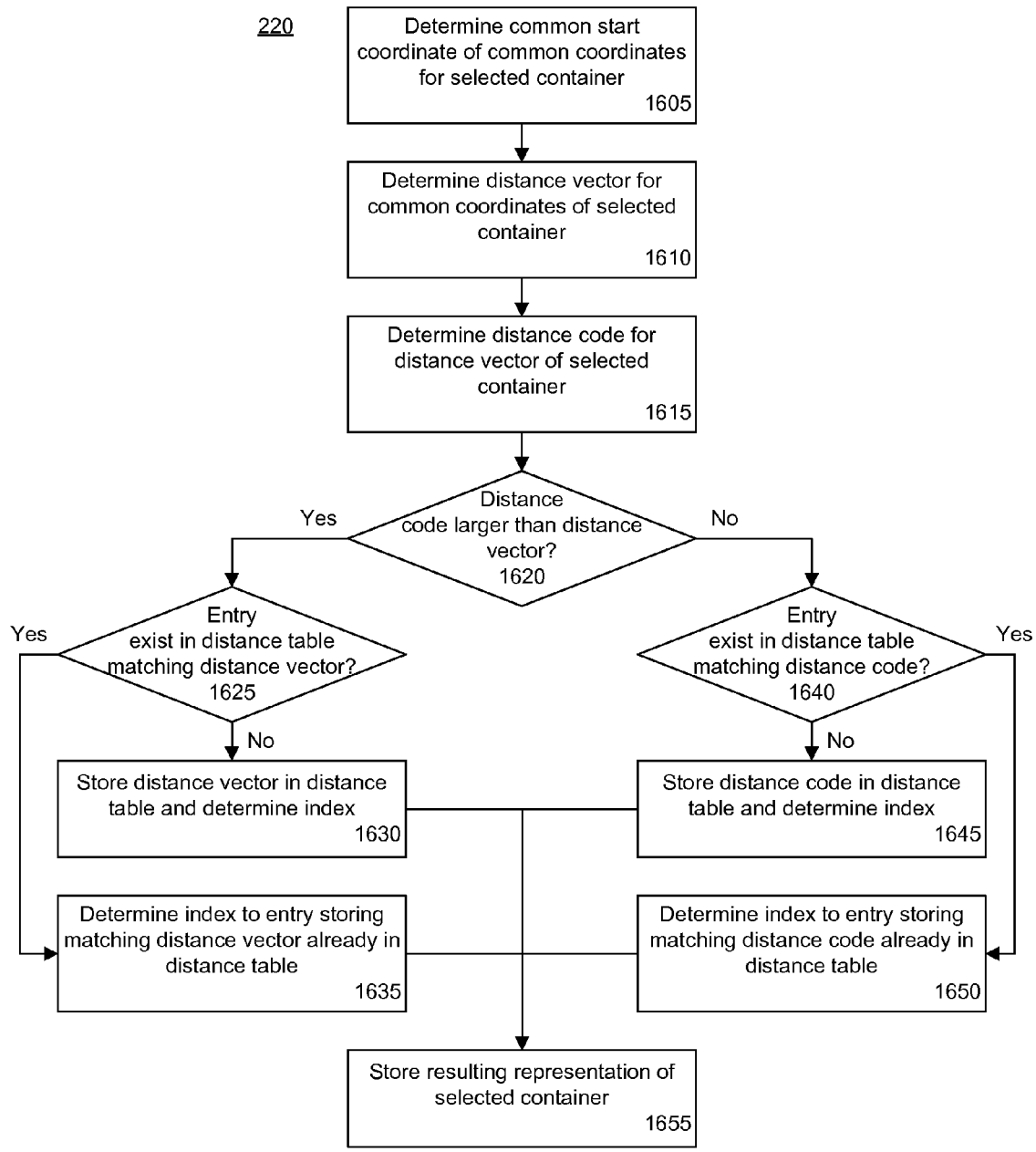
FIG. 16 is a fifth flow chart illustrating a method applying distance information to the GM data in accordance with another embodiment of the present invention.

FIG. 16 is a fifth flow chart illustrating a method applying distance information to the GM data in accordance with another embodiment of the present invention. More particularly, FIG. 16 illustrates a technique for performing step 220 of FIG. 2 as illustrated with reference to FIGS. 14 and 15 within this specification. FIG. 16 begins in a state following the implementation of step 1365 of FIG. 13, where the resulting representation of the GM data after application of distance encoding to the non-extracted coordinates, e.g., the second coordinate type, of the segment was applied. FIG. 16 is described with reference to a single, e.g., a selected, container. It should be appreciated that the method illustrated in FIG. 16 can be performed for each container of the GM data.

Accordingly, in step 1605, the system can determine a common start coordinate of the common coordinates of the selected container. When the segment type is a column, the common coordinates are x-coordinates. When the segment type is a row, the common coordinates are y-coordinates. The start coordinate of the common coordinates can be the lowest value of the common coordinates when sorted in increasing order.

Beginning in step 1610, the system can start determining second distance information. In step 1610, the system can determine a distance vector for the common coordinates. Referring to FIG. 14, for example, the distance vector can be calculated for consecutive x-coordinate pairs defined by the expressions "10–0" and "20–10." In step 1615, the system can continue with generation of the second distance information. In step 1615, the system can determine a distance code for the distance vector derived for the common coordinates of the selected container. For example, the system can perform RLE upon the distance vector of the container for the common coordinates to determine a corresponding distance code.

In step 1620, the system can compare the amount of memory required to store the distance vector, e.g., the size, with the amount of memory required to store the distance code of the vector code pair determined for the common coordinates of the selected container. The system can determine whether the distance code is larger than the distance vector. When the distance code is larger than the distance vector, the method can continue to step 1625. When the distance vector is larger than the distance code, the method can proceed to step 1640.

Proceeding with step 1625, where the system has determined that the distance vector is smaller than the distance code, the system can determine whether an entry exists in the distance table that specifies a distance vector matching the distance vector of the vector code pair for the common coordinates. When the system determines that the distance vector is smaller than the distance code, the RLE applied to the distance vector was unsuccessful in reducing the size of the distance information. Accordingly, the system can store the smaller sized distance vector within the distance table.

When the system determines that the distance table does not include an entry that specifies a distance vector matching the distance vector of the vector code pair for the common coordinates, the method can proceed to step 1630. When the system determines that the distance table already includes an entry that specifies a distance vector matching the distance vector of the vector code pair for the common coordinates, the method can continue to step 1635.

In step 1630, the system can store the distance vector of the vector code pair for the common coordinates within the distance table as an entry. The system can store or create, within the entry, an indicator specifying that the entry stores a distance vector as opposed to a distance code. The index into the distance table that specifies the newly stored entry can be determined and stored as part of the container to represent the common coordinates being processed. After step 1630, the method can continue to step 1655.

In step 1635, the system can determine the index that indicates the entry of the distance table that specifies a distance vector matching the distance vector of the vector code pair for the common coordinates. The index can be determined and stored as part of the container to represent the common coordinates being processed. After step 1635, the method can proceed to step 1655.

Referring to step 1640, where the system has determined that the distance code of the vector code pair for the common coordinates is smaller than the distance vector, the system can determine whether an entry exists in the distance table that specifies a distance code that matches the distance code of the vector code pair for the common coordinates. When the system determines that the distance code is smaller than the distance vector, the RLE applied to the distance vector was successful in reducing the size of the distance information. Accordingly, the system can store the smaller sized distance code within the distance table.

When the system determines that the distance table does not include an entry that specifies a distance code matching the distance code of the vector code pair for the common coordinates, the method can proceed to step 1645. When the system determines that the distance table already includes an entry that specifies a distance vector matching the distance vector of the vector code pair for the common coordinates, the method can continue to step 1650.

In step 1645, the system can store the distance code of the vector code pair for the common coordinates within the distance table as an entry. The system can store or create, within the entry, an indicator specifying that the entry stores a distance code as opposed to a distance vector. The index into the distance table that specifies the newly stored entry can be determined and stored as part of the container to represent the particular segment being processed. After step 1645, the method can continue to step 1655.

In step 1650, the system can determine the index that indicates the entry of the distance table that specifies a distance code matching the distance code of the vector code pair for the common coordinates. The index can be determined and stored as part of the container to represent the common coordinates being processed. After step 1650, the method can proceed to step 1655.

Proceeding to step 1655, the system can store the resulting representation of the container. The container, after the processing described in FIG. 15, includes indexes to distance vectors or distance codes within the distance table as opposed to a list of common coordinates for the segments. For example, the container can have a form or format as illustrated with respect to FIG. 15.

FIG. 16 describes an embodiment in which the system intelligently determines whether to store a distance vector or a distance code within the distance table. In another embodiment, the system complexity can be reduced in that the system can store only distance codes without performing a comparison of the size of the distance vector with the size of the distance code for each vector code pair.

It should be appreciated that the memory savings achieved using the compression techniques described within this specification are applicable not only to bulk storage devices, but also to runtime memory, e.g., local memory. Thus, the system using the GM data requires significantly less runtime memory than otherwise would be the case. GM data compressed as described herein can be used by a system while incurring little or no performance degradation in consequence of decoding. For example, operations such as zooming, panning, and item selection within the generated visual model suffer little or no performance degradation.

One runtime enhancement that can be implemented, however, to minimize performance degradation, if any, is to expand particular distance information into cumulative distances within local memory 120 for runtime use by the system. Cumulative distances allow the system to reproduce an original coordinate with just a single addition operation from the start coordinate. This expansion, or partial decoding, occupies slightly more memory than distance codes. The increase in memory usage, however, is a small fraction of the overall memory usage of the compressed GM data.

Figures 17, 18:
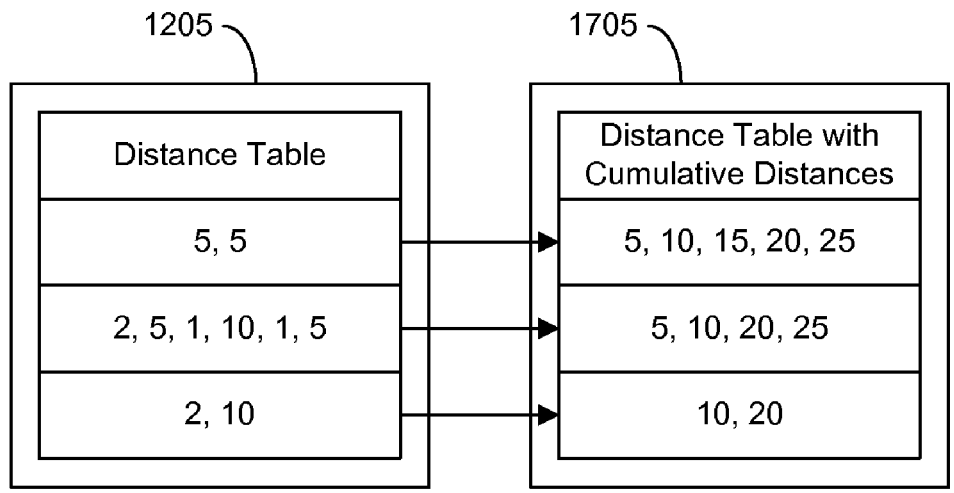
FIG. 17 is a ninth block diagram illustrating an expansion of a distance code to a cumulative distance in accordance with another embodiment of the present invention.
FIG. 18 is a fourth table illustrating the use of cumulative distance in accordance with another embodiment of the present invention.

FIG. 17 is a ninth block diagram illustrating an expansion of a distance code to a cumulative distance in accordance with another embodiment of the present invention. More particularly, FIG. 17 illustrates distance table 1205 and an expansion 1705 of distance table 1205 where each distance code has been expanded or partially decoded to a cumulative distance. Consider the distance code {5, 5} as an example. The cumulative distance expansion of distance code {5, 5} is {5, 10, 15, 20, 25}. The cumulative distance produces the coordinates 5, 10, 15, 20, 25, and 30 efficiently by first taking the start coordinate of 5 in this example as the first value and then adding the start coordinate to each of the values of the cumulative distance.

FIG. 18 is a fourth table 1800 illustrating the use of cumulative distance in accordance with another embodiment of the present invention. More particularly, FIG. 18 illustrates how coordinates can be derived from a cumulative distance through a single addition operation for each resulting coordinate. As noted, the first of the coordinates derived using the cumulative distance is the start coordinate. The remaining values are determined by adding the start coordinate to each one of the values of the cumulative distance. In this manner, the distance table can be stored in local memory in this expanded form to increase runtime efficiency.

It should be appreciated that a system, as described within this specification, further can decode information by applying the variously described steps and/or operations in the reverse order. Since the processes for compressing the GM data have been described in significant detail, for purposes of brevity, the decoding of GM data, and particularly containers, is described without reference to accompanying drawing figures.

For example, the system can expand the common coordinates of a container using the common start coordinate and the second distance information for the container. In this manner, the index into the distance table within the container can be replaced with the distance information specified by the index. The common start coordinate and distance information can be decoded into the common coordinates. This can be performed on a per container basis.

The system can expand the non-extracted coordinates, e.g., the y-coordinates in reference to the examples described within this specification. The non-extracted coordinates can be expanded according to the segment start coordinate for each segment and the stored index for each segment of the container. For each segment, the index can be replaced with the first distance information. For each segment, the non-extracted coordinates can be decoded using the common start coordinate and the distance information. This processing can be performed on a per container basis.

The system further can determine the type of segments within each container according to the configuration byte of each respective container. The system can decode the containers by inserting the common coordinate back into the appropriate location within each respective container, e.g., whether a row, column, etc., as determined by the configuration byte. The system can insert, back into each call, on a per container basis, the header and macro identifier of the container.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments of the present invention can be realized in hardware or a combination of hardware and software. The one or more embodiments can be realized in a centralized fashion in one system or in a distributed fashion where different elements are spread across several interconnected systems. Any kind of data processing system or other apparatus adapted for carrying out the methods described herein is suited.

One or more embodiments of the present invention further can be embedded in a device such as a computer program product, which comprises all the features enabling the implementation of the methods described herein. The device can include a non-transitory data storage medium, e.g., a computer-usable or computer-readable medium, storing program code that, when loaded and executed in a system comprising memory and a processor, causes the system to perform the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A method of compressing data, the method comprising:
    forming at least one container by grouping calls of data according to at least one data element of each call;
    arranging, via a processor, calls of the at least one container into a plurality of segments according to a minimal coordinate set and extracting common coordinates corresponding to a first coordinate type from the plurality of segments;
    replacing coordinates of a second coordinate type of each segment of the at least one container with a segment start coordinate and first distance information specifying the coordinates of the second coordinate type; and
    replacing the common coordinates of the at least one container with a common start coordinate and second distance information.

2. The method of claim 1, wherein forming at least one container further comprises:
    determining the at least one data element of each call of the data;
    sorting each call of the data according to the at least one data element; and
    assigning calls having a same at least one data element into same containers.

3. The method of claim 1, wherein arranging calls of the at least one container into the plurality of segments further comprises:
    determining unique coordinate values from calls of the at least one container for each of the first and second coordinate types;
    determining that a number of unique coordinate values of the first coordinate type is less than a number of unique coordinate values of the second coordinate type; and
    arranging the calls of the container into the plurality of segments according to the first coordinate type and unique coordinate values of the first coordinate type.

4. The method of claim 3, further comprising:
    responsive to determining that x-coordinates are the first coordinate type, arranging the calls into columns; and
        for each column, determining a common coordinate among calls and extracting the common coordinate from each call; and
    responsive to determining that y-coordinates are the first coordinate type, arranging the calls into rows; and
        for each row, determining a common coordinate among calls and extracting the common coordinate from each call.

5. The method of claim 1, wherein replacing coordinates of the second coordinate type of each segment further comprises, for each segment of the at least one container:
    selecting a lowest coordinate value of coordinates of the second coordinate type as the segment start coordinate;
    generating a distance vector specifying distances between consecutive pairs of the coordinates of the second coordinate type of the segment when sorted lowest to highest;
    run length encoding the distance vector to generate a distance code; and
    selectively storing the distance vector or the distance code within an entry within a distance table as the first distance information, wherein the at least one container comprises an index to the entry.

6. The method of claim 5, wherein selectively storing the distance vector or the distance code comprises:
   determining whether the distance code is smaller than the distance vector;
   when the distance code is smaller than the distance vector, storing the distance code within the entry;
   when the distance vector is smaller than the distance code, storing the distance vector within the entry; and
   storing an indication within the entry specifying whether the entry stores a distance vector or a distance code.

7. The method of claim 5, wherein selectively storing the distance vector or the distance code comprises:
   when storing the distance vector, only storing the distance vector responsive to determining that no existing entry within the distance table specifies the distance vector; and
   when storing the distance code, only storing the distance code responsive to determining that no existing entry within the distance table specifies the distance code.

8. The method of claim 1, wherein replacing the common coordinates of the at least one container comprises:
   selecting a lowest coordinate value of the common coordinates of the at least one container as the common start coordinate;
   generating a distance vector specifying distances between consecutive pairs of the common coordinates when sorted lowest to highest;
   run length encoding the distance vector to generate a distance code; and
   selectively storing the distance vector or the distance code within an entry within a distance table as the second distance information, wherein the at least one container comprises an index to the entry.

9. The method of claim 8, wherein selectively storing the distance vector or the distance code comprises:
   determining whether the distance code is smaller than the distance vector;
   when the distance code is smaller than the distance vector, storing the distance code within the entry;
   when the distance vector is smaller than the distance code, storing the distance vector within the entry; and
   storing an indication within the entry specifying whether the entry stores a distance vector or a distance code.

10. The method of claim 8, wherein selectively storing the distance vector or the distance code comprises:
    when storing the distance vector, only storing the distance vector responsive to determining that no existing entry within the distance table specifies the distance vector; and
    when storing the distance code, only storing the distance code responsive to determining that no existing entry within the distance table specifies the distance code.

11. A system for compressing data comprising:
    a memory storing program code; and
    a processor coupled to the memory and executing the program code, wherein the processor is configured to perform steps comprising:
        forming at least one container by grouping calls of data according to at least one data element of each call;
        arranging calls of the at least one container into a plurality of segments according to a minimal coordinate set and extracting common coordinates corresponding to a first coordinate type from the plurality of segments;
        replacing coordinates of a second coordinate type of each segment of the at least one container with a segment start coordinate and first distance information specifying the coordinates of the second coordinate type;
        replacing the common coordinates of the at least one container with a common start coordinate and second distance information; and
        storing the at least one container within the memory.

12. The system of claim 11, wherein arranging calls of the at least one container into the plurality of segments further comprises:
    determining unique coordinate values from calls of the at least one container for each of the first and second coordinate types;
    determining a number of unique coordinate values of for each of the first and the second coordinate types; and
    arranging the calls of the container into the plurality of segments according to which of the first or second coordinate types has fewest unique coordinate values.

13. The system of claim 12, wherein the processor is further configured to perform steps comprising:
    responsive to determining that x-coordinates are the first coordinate type, arranging the calls into columns; and
        for each column, determining a common coordinate among calls and extracting the common coordinate from each call; and
    responsive to determining that y-coordinates are the first coordinate type, arranging the calls into rows, and
        for each row, determining a common coordinate among calls and extracting the common coordinate from each call.

14. The system of claim 11, wherein replacing coordinates of the second coordinate type of each segment further comprises, for each segment of the at least one container:
    selecting a lowest coordinate value of coordinates of the second coordinate type as the segment start coordinate;
    generating a distance vector specifying distances between consecutive pairs of the coordinates of the second coordinate type of the segment when sorted lowest to highest;
    run length encoding the distance vector to generate a distance code; and
    selectively storing the distance vector or the distance code within an entry within a distance table as the first distance information, wherein the at least one container comprises an index to the entry.

15. The system of claim 11, wherein replacing the common coordinates of the at least one container comprises:
    selecting a lowest coordinate value of the common coordinates of the at least one container as the common start coordinate;
    generating a distance vector specifying distances between consecutive pairs of the common coordinates when sorted lowest to highest;
    run length encoding the distance vector to generate a distance code; and
    selectively storing the distance vector or the distance code within an entry within a distance table as the second distance information, wherein the at least one container comprises an index to the entry.

16. A device comprising:
    a non-transitory data storage medium usable by a system comprising a processor and a memory, wherein the non-transitory data storage medium stores program code that, when executed by the system, causes the system to execute operations for performing data compression comprising:

forming at least one container by grouping calls of data according to at least one data element of each call;

arranging calls of the at least one container into a plurality of segments according to a minimal coordinate set and extracting common coordinates corresponding to a first coordinate type from the plurality of segments;

replacing coordinates of a second coordinate type of each segment of the at least one container with a segment start coordinate and first distance information specifying the coordinates of the second coordinate type;

replacing the common coordinates of the at least one container with a common start coordinate and second distance information; and storing the at least one container within the memory.

17. The device of claim 16, wherein arranging calls of the at least one container into the plurality of segments further comprises:

determining unique coordinate values from calls of the at least one container for each of the first and second coordinate types;

determining a number of unique coordinate values of for each of the first and the second coordinate types; and arranging the calls of the container into the plurality of segments according to which of the first or second coordinate types has fewest unique coordinate values.

18. The device of claim 17, wherein the non-transitory data storage medium further stores program code that causes the system to perform executable operations comprising:

responsive to determining that x-coordinates are the first coordinate type, arranging the calls into columns; and for each column, determining a common coordinate among calls and extracting the common coordinate from each call; and responsive to determining that y-coordinates are the first coordinate type, arranging the calls into rows; and for each row, determining a common coordinate among calls and extracting the common coordinate from each call.

19. The device of claim 16, wherein replacing coordinates of the second coordinate type of each segment further comprises, for each segment of the at least one container:

selecting a lowest coordinate value of coordinates of the second coordinate type as the segment start coordinate;

generating a distance vector specifying distances between consecutive pairs of the coordinates of the second coordinate type of the segment when sorted lowest to highest;

run length encoding the distance vector to generate a distance code; and selectively storing the distance vector or the distance code within an entry within a distance table as the first distance information, wherein the at least one container comprises an index to the entry.

20. The device of claim 16, wherein replacing the common coordinates of the at least one container comprises:

selecting a lowest coordinate value of the common coordinates of the at least one container as the common start coordinate;

generating a distance vector specifying distances between consecutive pairs of the common coordinates when sorted lowest to highest;

run length encoding the distance vector to generate a distance code; and selectively storing the distance vector or the distance code within an entry within a distance table as the second distance information, wherein the at least one container comprises an index to the entry.

* * * * *